(12) United States Patent
Kranski et al.

(10) Patent No.: US 12,124,651 B2
(45) Date of Patent: *Oct. 22, 2024

(54) COMBINED ANALOG AND DIGITAL ARCHITECTURE FOR HANDLING SENSORY INPUT DATA

(71) Applicant: Sanctuary Cognitive Systems Corporation, Vancouver (CA)

(72) Inventors: Jeff Kranski, Campbell, CA (US); Adrian Kaehler, Campbell, CA (US)

(73) Assignee: Sanctuary Cognitive Systems Corporation, Vancouver (CA)

( * ) Notice: Subject to any disclaimer, the term of this patent is extended or adjusted under 35 U.S.C. 154(b) by 32 days.

This patent is subject to a terminal disclaimer.

(21) Appl. No.: 18/114,453

(22) Filed: Feb. 27, 2023

(65) Prior Publication Data

US 2023/0244342 A1 Aug. 3, 2023

Related U.S. Application Data

(63) Continuation of application No. 17/711,983, filed on Apr. 1, 2022, now Pat. No. 11,625,122.

(60) Provisional application No. 63/169,718, filed on Apr. 1, 2021.

(51) Int. Cl.
*G06F 3/041* (2006.01)
*G06F 17/14* (2006.01)
*H03M 3/00* (2006.01)

(52) U.S. Cl.
CPC ........ *G06F 3/04166* (2019.05); *G06F 17/142* (2013.01); *H03M 3/496* (2013.01)

(58) Field of Classification Search
None
See application file for complete search history.

(56) References Cited

U.S. PATENT DOCUMENTS

| | | | |
|---|---|---|---|
| 2016/0209966 A1* | 7/2016 | Jung | G06F 3/0446 |
| 2016/0224164 A1* | 8/2016 | Huang | G06F 3/044 |
| 2018/0260067 A1* | 9/2018 | Choi | G06F 3/04166 |
| 2020/0089385 A1* | 3/2020 | Han | G06F 3/04166 |
| 2021/0191417 A1* | 6/2021 | Chun | G06F 3/013 |
| 2022/0197436 A1* | 6/2022 | Perreault | G06F 3/0446 |

* cited by examiner

*Primary Examiner* — Krishna P Neupane
(74) *Attorney, Agent, or Firm* — Adenike Adebiyi; Thomas Mahon

(57) ABSTRACT

A system includes a robot having contact surfaces and a sensor array having a spatially distributed touch sensors disposed on the contact surfaces. Each touch sensor has an identifier and outputs an analog signal at a set of frequencies associated with the identifier The sensor array outputs a combined analog signal representative of a combination of the analog signals outputted by the touch sensors. The system includes an analog-to-digital converter that generates a digital signal in a time domain based on the combined analog signal. The system includes one or more processing units that transforms the digital signal from the time domain to a frequency domain and detects locations of touch within the sensor array based on frequencies observed the frequency domain and the identifiers of the touch sensors.

19 Claims, 4 Drawing Sheets

COMBINED ANALOG AND DIGITAL ARCHITECTURE FOR HANDLING SENSORY INPUT DATA

CROSS-REFERENCE TO RELATED APPLICATIONS

This application is a continuation of U.S. patent application Ser. No. 17/711,983, filed Apr. 1, 2022, which claims the benefit of U.S. Provisional Application No. 63/169,718, filed Apr. 1, 2021, the contents of which are incorporated herein in their entirety by reference.

FIELD

The present disclosure relates generally to robotics and, more specifically, to a combined analog and digital architecture for handling sensory input data.

BACKGROUND

Dynamic mechanical systems are often controlled with computational processes. Examples include robots, industrial processes, life support systems, and medical devices. Generally, such a process takes input from sensors indicative of state of the dynamic mechanical system and its environment and determines outputs that serve to control various types of actuators within the dynamic mechanical system, thereby changing the state of the system and potentially its environment.

Control process often rely on tactile feedback from various sensors, like touch tensors, disposed on the mechanical system to detect contact. In many cases, multiple such sensors, like an array of such sensors, which may cover a relatively large surface area are employed. In many cases, reads of arrays of touch sensors may suffer from low latency, low resolution, or both, depending on the tradeoffs of the implementation.

SUMMARY

The following is a non-exhaustive listing of some aspects of the present techniques. These and other aspects are described in the following disclosure.

Some aspects include a system, including: a plurality of spatially distributed touch sensors sharing a signal medium, each touch sensor in the plurality being configured to output set of frequencies on the signal medium responsive to being touched, each touch sensor in the plurality being configured to output a different set of frequencies; an analog to digital converter electrically coupled to the signal medium and configured to receive the sets of frequencies from the touch sensors and convert the sets of frequencies to digital representations of the sets of frequencies in the time domain; a processor communicatively coupled to the analog to digital converter and configured to execute a fast Fourier transform of the digital representations from the time domain into digital representations in the frequency domain; and an address decoder operative to transform the digital representations in the frequency domain into identifiers of touch sensors among the plurality of touch sensors.

BRIEF DESCRIPTION OF THE DRAWINGS

The above-mentioned aspects and other aspects of the present techniques will be better understood when the present application is read in view of the following figures in which like numbers indicate similar or identical elements.

Figure 1:
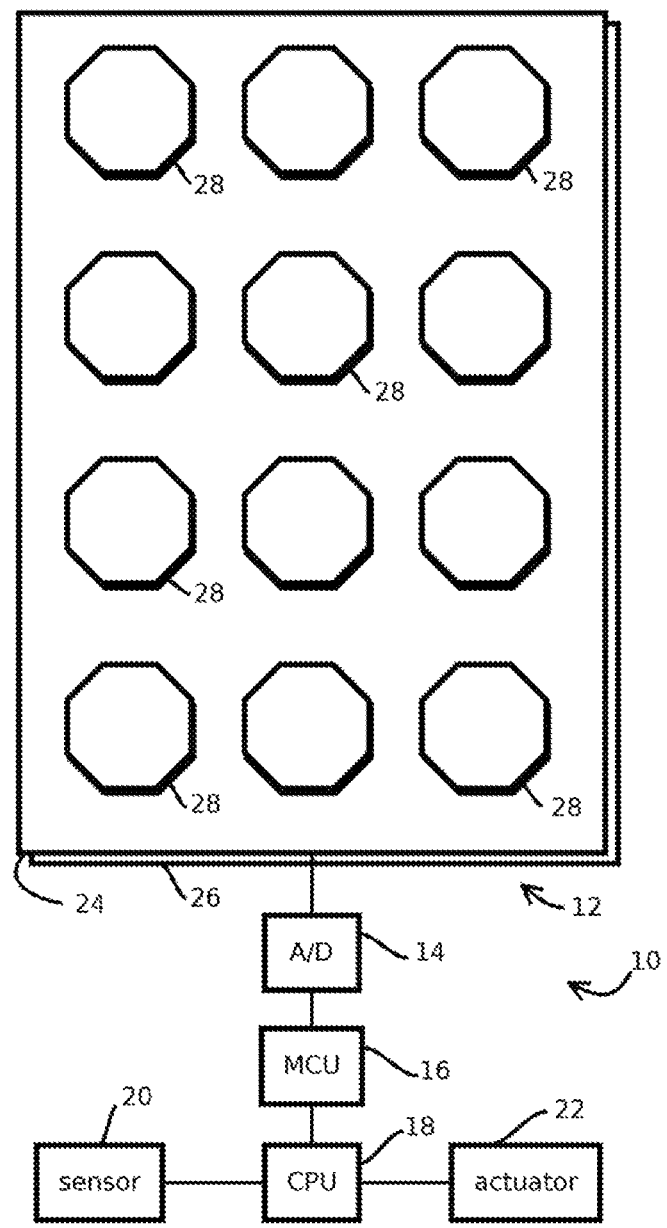
FIG. 1 is an example computing environment for operation of one or more robots, in accordance with some example embodiments.

While the present techniques are susceptible to various modifications and alternative forms, specific embodiments thereof are shown by way of example in the drawings and will herein be described in detail. The drawings may not be to scale. It should be understood, however, that the drawings and detailed description thereto are not intended to limit the present techniques to the particular form disclosed, but to the contrary, the intention is to cover all modifications, equivalents, and alternatives falling within the spirit and scope of the present techniques as defined by the appended claims.

DETAILED DESCRIPTION OF CERTAIN EMBODIMENTS

To mitigate the problems described herein, the inventors had to both invent solutions and, in some cases just as importantly, recognize problems overlooked (or not yet foreseen) by others in the fields of artificial intelligence and robotics. Indeed, the inventors wish to emphasize the difficulty of recognizing those problems that are nascent and will become much more apparent in the future should trends in industry continue as the inventors expect. Further, because multiple problems are addressed, it should be understood that some embodiments are problem-specific, and not all embodiments address every problem with traditional systems described herein or provide every benefit described herein. That said, improvements that solve various permutations of these problems are described below.

In many applications, it may be desirable to use a grid-based tactile sensing array with a relatively high degree of precision afforded by relatively high spatial densities of read points (e.g., 10, 50, 100 or more per square centimeter). However, many existing touch sensors for robotics provide relatively low-resolution touch data with relatively high latency. In many cases, this is because of the way signals are read-out of the touch sensor. For example, some systems sample each sensing element serially, or one at a time, repeatedly scanning across an array of sensors, thereby introducing latency between successive scans before a touch can be detected, which is not to suggest that scanning approaches or any other technique is disclaimed. Additionally, where cost is a concern, examples of grid-based tactile sensing arrays described herein may be relatively low cost to other implementation utilizing discrete sensors rather than a grid-based (or other tiling, such as an irregular tiling) array.

One approach to mitigate latency is to concurrently read-out touch data from an array of touch sensors, for example on a shared medium over which some or all of the individual sensing elements transmit signals. An example of such a sensor is described in Lee et al, *A neuro-inspired artificial peripheral nervous system for scalable electronic skins*, Science Robotics 17 Jul. 2019, Vol. 4, Issue 32, eaax2198, the contents of are hereby incorporated by reference, as the article describes a sensor that may be used with the techniques below. In some examples, filters, like bandpass-filters, each tuned to selectively pass a variety of different respective frequencies may be attached to a shared medium, and each individual touch sensing element may be configured to transmit a unique frequency or pattern of frequencies that distinguishes that touch element signals from signals from other touch elements. The output of each bandpass filter may then be connected to an analog-to-digital converter, and an array of such bandpass filters and analog-to-digital converters, connected in series with the shared medium over which signals are conveyed from touch sensing elements, may output a stream of digital codes indicating which touch sensing elements are firing.

One challenge to this approach is the complexity and expense of providing a sufficient number of bandpass filters and analog-to-digital converters to distinguish a relatively large number of touch sensing elements in a dense array. Even with spread spectrum techniques, like code division multiple access, coding signals in a way that distinguishes a relatively large number of such components will be challenging for read-out when the number of touch sensing elements sharing a transmission medium reaches commercially useful counts, for example, numbering greater than 10 per square centimeter, 100 per square centimeter, or 1000 per square centimeter or more. In the example array described in Lee, each sensor (referred to therein as a receptor) is coupled to a microcontroller disposed at each sensing location within the array. Some embodiments may eschew such a requirement, further reducing cost and affording greater density of sensing locations as they need not be restricted by size of a microcontroller (which, for example, may restrict density to less than one sensor per square millimeter, e.g., an example ATTNY20 microcontroller may be approximately 1.5×1.5 mm). None of which is to suggest that this approach or any other technique is disclaimed herein, as the techniques described below may be used in combination with arrays of bandpass filters and separate analog-to-digital converters, for instance, by using wider bands and bandpass filters to reduce their number and then processing the downstream signals in the manner described below with replicated instances of the below described microcontrollers each processing different segments of a frequency spectrum while still reducing the complexity of hardware involved.

Some embodiments may mitigate some of the above issues by quantizing a frequency spectrum in software rather than in hardware (or in combination with hardware that performs coarser quantization relative to the number of touch sensing elements sharing a medium). Some embodiments may omit inclusion of a microcontroller disposed at every sensing point within a sensor array to reduce cost and increase density. Some embodiments may use a single analog-to-digital converter, for example, and then process the output of the analog-to-digital converter with a microcontroller or digital signal processor executing a fast Fourier transform. The fast Fourier transform may transform signals on the shared medium conveying information from the touch sensing elements from the time domain into the frequency domain. In some embodiments, the signals in the frequency domain may then be transformed into locations of individual touch sensing elements, for instance, with a lookup table mapping individual frequencies or patterns of frequencies to distinct touch sensing elements in an array coupled to the medium, or a dynamic mapping may be used, e.g., with spread spectrum techniques, like code division multiple access. The mapping may be performed by an address decoder process in some embodiments.

The techniques are described with reference to robots, but it should be appreciated that other use cases are contemplated, e.g., touch screen sensors, touch sensors on other devices like kiosks and smart applicants, touch sensors on prosthetic limbs, and the like. Similarly, the present techniques are described with reference to electrical systems, by similar approaches are contemplated for systems that use optical signals, e.g., overlaying light at different frequencies in a wave guide.

FIG. 1 shows an example of a dynamic mechanical system 10, such a robot, having touch sensing capabilities that uses a fast Fourier transform for read-out, in some embodiments. Some embodiments of a touch sensor 12 may include an analog-to-digital converter 14 and a microcontroller 16. In some examples, a touch sensor 12 may be coupled to an analog-to-digital converter 14, and the analog-to-digital converter 14 may be coupled to the microcontroller 16 or provide output on a bus to which the microcontroller 16 is coupled. In some examples, the touch sensor 12, or a plurality of iterations thereof, may provide output on a bus to which an analog-to-digital convert 14 is coupled.

In some embodiments, the dynamic mechanical system 10 further includes a central processing unit 18, a different type of sensor 20 (e.g., camera array, motor current sensor, multi-axis inertial measurement unit, lidar, or the like), and an actuator 22 (e.g., a servo or stepper motor). A single touch sensor 12, sensor 20, CPU 18, and actuator 22 are shown by way of example, but it should be appreciated that embodiments may include substantially more of each of these components and diverse types of each of these components.

In some embodiments, the touch sensor 12 includes, in addition to the analog-to-digital converter 14 and the microcontroller 16, a signal plane 24, a power plane 26, and an array of touch sensing elements 28. In some embodiments, the touch sensing elements 28 may selectively transmit signals on the signal plane 24, drawing power from the power plane 26, responsive to mechanical contact with, and resulting forces applied thereto, the individual touch sensing elements 28. In some embodiments, the touch sensing elements may be arranged in a rectangular lattice, like that shown, or they may be arranged in other patterns, like a hexagonal lattice. In the illustrated embodiment, each of the touch sensing elements 28 is the same shape and size, forming a regular tiling, but embodiments are also consistent with irregular tilings, for instance with larger touch sensing elements positioned in areas in which lower granularity of spatial sensing of touch events is needed, and smaller, more densely packed touch sensing elements 28 positioned in other areas.

In some embodiments, different touch sensing elements 28 in the array may be responsive to different kinds of force, for example, some touch sensing elements 28 may be responsive to shear forces while others responsive to normal forces, and in some cases, some touch sensing elements 28 are responsive to shear forces in different directions, for instance, with some being orthogonal to others in their sensing direction. In some embodiments, touch sensing elements 28 may also include elements responsive to other phenomena, like temperature, moisture, or strain in the underlying substrate (e.g., strain gauges in various orientations), and those sensing elements may similarly convey data in the manner described. In some embodiments, none of the sensing elements 28 are touch sensing elements, and all our configured to sense one or more of those other properties, which is not to suggest that any other described feature is required in all embodiments.

In some embodiments, the touch sensing elements 28 may be responsive to a force applied normal to the signal plane 24, in some cases outputting a binary signal responsive to that force exceeding a threshold, or in some places cases outputting a signal indicative of the amount of force with greater granularity, like an eight bit or four bit signal corresponding to the strength of the force or an analog signal, for instance an amplitude of the below described unique frequencies or frequency patterns, corresponding to the strength of the force applied. Thus, for example, the sensor array may be a force-sensitive tactile array including a grid-like arrangement of potential points (e.g., discrete units of area that produce a single signal responsive to force) of measurement of force (e.g., resultant from force exerted by a contact within a corresponding area of the array or vice versa). Different sensing elements 28 corresponding to different discrete units of area may each output a single signal, like an analog signal, responsive to force detected by the respective sensing element on a shared medium, such as signal plane 24. Thus, for example, these single signals may be combined on the signal plane 24. Accordingly, output from the signal plan 24 may be an analog signal that is a combination of the collection of sensor readings output on the plane. To distinguish between the readings output by the different sensing elements on the signal plane 24 from the combined analog signal, frequency or code division multiple access may be used. For example, different sensors may output their different readings on different frequencies. Processing of the combined analog signal may be performed to observe components of the analog signal within a frequency domain rather than time domain. The observed components at respective frequencies within the frequency domain may corresponding to respective sensor readings output at a corresponding frequency. Thus, for example, embodiments may parse out the individual readings from the combined analog signal using a Fourier transform or other frequency domain analysis technique.

Examples of touch sensing elements 28 may include capacitive plates held apart by a resilient dielectric member, where compressing that member causes a natural frequency of the resulting capacitor to change. In some examples, capacitors having different natural frequency responses may be provisioned in different locations of a touch sensing array. For example, patches of material modifying capacitance may be disposed within different areas to modify natural frequencies of different areas. In some cases, more material or less material may be added in different areas. In some examples, components of different capacitor values or response frequency may be selected. In some cases, different dielectric materials may be selected. Thus, for example, a read of the array, such as by providing power or a signal to the power plane 26, may cause a capacitor to output a signal at its natural frequency on the signal plane 24. Stimuli receiving in the corresponding area of the array may cause the natural frequency response of the capacitor to change. For example, a frequency response of the capacitor under stimuli may be displaced from its natural frequency response. Thus, for example, embodiments may detect the lack of a response at the natural frequency to be indicative of a touch received within the corresponding area of the capacitor. In some examples, the frequency response may not change but an amplitude may change, thus yielding to a different in amplitude in a response at the natural frequency. In some cases, a frequency response may be displaced relative to a natural frequency within a range, like a bin in the frequency domain within which responses to touch within the corresponding area are detected. In some examples, an amount of displacement of a frequency response from a natural frequency within the range of the bin in the frequency domain corresponding to the sensor may be indicative of force applied within the corresponding area.

Another example sensing element may include resistive touch sensors. For example, a grid-based resistive touch sensing array may include a plurality of touch sensing elements, which correspond to different areas of the sensing array. A resistive sensing element, like a membrane or material that changes in resistance due to stimuli may output a value (e.g., like a voltage) corresponding to resistance produced in the area by some local stimuli, like force, deformity, temperature, light-intensity, and the like. In some cases, an inductor or capacitor or other component having a natural frequency response may be coupled (e.g., in series or parallel) with a resistor. The sensing element may receive power from the power plane 26. Thus, for example, a stimuli may cause a value of a resistor to change, thereby inducing a response from an inductive or capacitive element based on a change in current or voltage due to the change in resistance that is output on a signal plane 24.

In some examples, a sensing element, or several sensing elements, may be paired with a microcontroller. An example of which may include, but is not limited to, ATTNY20 microcontroller, or relatively small micro controller, and instances thereof may be disposed throughout a sensor array. The micro controller may draw power from the power plane 26, receive input from a co-located or one or more nearby sensing elements, and provide output on the signal plane 24. The output may be provided onto the signal plane 24 using frequency or code division multiple access, such that the output of the micro controller for one or more sensors (e.g., within a first area of the array) may be distinguished from that of other micro controllers corresponding to other sensors in other areas. For example, considering frequency division multiple access approaches, the micro controller may output one or more signals within a bin of the frequency domain assigned to the microcontroller for reporting sensor outputs. In some examples, the micro controller may output a series of a signals at different frequencies within the bin, each frequency corresponding to a different one of the sensing elements from which the micro controller receives input. However, as outlined above, it should be emphasized that disclosed techniques are extendable to other types of sensors and array architectures (e.g., some of which may include, or not include, micro controllers disposed in relation to sensing elements within a sensor array), which is not to suggest that other descriptions are limiting.

In some embodiments, the power plane 26 and the signal plane 24 are each a conductive plane, for instance, isolated from one another by a dielectric layer. In some embodiments, interconnects may extend from the touch sensing elements 28 down to the power plane 26, through the dielectric layer, and through an insulator isolating those contacts from the signal plane 24. In some embodiments, another contact from the touch sensing elements 28 may extend to the signal plane 24, thereby placing each of the touch sensing elements 28 in series between the power plane 26 and the signal plane 24. In some embodiments, the signal plane 24 or the power plane 26 or both may be electromagnetically shielded, for example, with additional conductive planes disposed above and below the arrangement illustrated, sandwiching the planes 24 and 26 and shielding them from external electromagnetic radiation, thereby potentially affording lower noise in the system and greater responsiveness. In some embodiments, the conductive planes and dielectric layers therebetween, like layers 24 and 26, may be flexible and in some cases resilient. Examples include woven steel mesh fabrics or copper mesh fabrics and conductive sheets of polymer, like polymeric layers with embedded conductors like carbon fiber or various metal fibers. In some cases, multiple signal planes 24 may be used to create a bus of signal planes, and the techniques described below may be applied to signals from each of the planes to increase frequency re-use and support greater spatial density of sensing elements. In some embodiments, touch sensing elements 28 may be coupled in a cross point array with an access element, like a diode or transistor, coupling each respective element 28 to a respective column by which read-request signals are input and a column by which read-output signals are output the analog to digital converter. Read-request signals may be at a different frequency (e.g., driven by a differently tuned RC oscillator or ring oscillator) for each row in some embodiments. In some embodiments, the roles of such rows and columns may be reversed. In some embodiments, a read-request signal may take the form of an impulse (like a square wave) applied to a shared input medium coupled to a plurality of touch sensing elements 28, and each of the touch sensing elements 28 sharing that input medium (like a conductive plate or trace) may be tuned to resonate in a different frequency band (e.g., with different base resistances or capacitances coupled to a resistance or capacitance that varies responsive to force applied). Sensed touches do not require some external object move to "touch" the sensor and may arise from the sensor itself moving through space, causing a moving sensor to make contact with another object, for instance when a sensor is coupled to a contact surface on an end effector of a robotic arm.

In some embodiments, the analog-to-digital converter 14 may sense analog signals on the signal plane 24 and convert those analog signals into digital signals, for instance with a sampling frequency more than twice that of the highest frequency used by the array of sensing elements 28. In some embodiments, the analog-to-digital converter may include a Delta Sigma modulator operative to sense even relatively attenuated signals, for example, in power sensitive use cases. For example, in some examples a sensor array may be placed in a low power mode or state to reduce power consumption. A Delta Sigma modulator may more accurately convert attenuated signals into digital representations while the sensor array is operated in a low power state. In a conventional ADC, an analog signal input is sampled with a sampling frequency and subsequently quantized into a digital signal output. This process may introduce quantization error noise, which may reduce the ability to distinguish an attenuated signal from noise. Delta-sigma modulation may encode change in the signal, rather than only (or instead of) amplitude at a sample point, and output a stream of pulses which may be indicative of changes in amplitude that may propagate with a frequency corresponding to a detected change in the analog input. Thus, for example, a change may propagate with a frequency associated with a given sensor based on change in output of that sensor on that frequency. Accuracy of the modulation may further be improved by passing a digital output (e.g., of an analog-to-digital converter) through a low-resolution DAC and adding that resulting analog signal to an original input signal prior to Delta Sigma modulation, thereby reducing error potential in the output of the Delta Sigma modulator.

In some embodiments and output of the analog-to-digital converter 14, like a stream of digital data encoding a waveform received by the analog-to-digital converter 14 may be received by the microcontroller 16. Or in some embodiments, the analog-to-digital controller 14 and microcontroller 16 may be implemented with a digital signal processor that otherwise performs the described functions. In some embodiments, the microcontroller 16 may execute a fast Fourier transform (FFT) on the received stream of digital data from the analog-to-digital converter 14, transforming that binary stream from the time domain into the frequency domain. The FFT, in some cases, may be implemented with the Cooley-Tukey algorithm (e.g., in the form of a radix-2 decimation-in-time FFT), the Prime-factor FFT algorithm, Bruun's FFT Algorithm, Rader's FFT algorithm, Bluestein's FFT algorithm, the Hexagonal fast Fourier transform, or a combination thereof. Signal lines between the analog-to-digital converter 14 and microcontroller 16 are illustrated as a single line, but it should be understood that embodiments are consistent with wider buses, for example in a 16 or 64 bit wide bus. Similar variation is contemplated for the other illustrated signal lines, though in some cases the signal line between analog-to-digital converter 14 and the signal plane 24 may be a single conductor, like a signal wire in a coaxial cable, for example in shielded use cases.

In some embodiments, the microcontroller 16 may include in memory a lookup table that maps particular frequencies to particular sensing elements 28. In some embodiments, each sensing element 28 may correspond to a different frequency with which that sensing element transmit signals on the signal plane 24, and in some cases an amplitude of the received signals may indicate a strength of force, temperature, shear, or the like. In some embodiments, those amplitudes may be converted by the microcontroller 16 into a multi-bit value indicating the force based upon the amplitude of the corresponding frequency produced at the output of the fast Fourier transform. In some embodiments, individual sensing elements 28 may each correspond to a range of frequencies, and the output of the fast Fourier transform may be binned (or parameters tuned) according to that range, e.g., with signals being integrated over the range to indicate strength of force or other property. In some embodiments, individual sensing elements 28 may each have a unique pattern of frequencies, like two, four, or eight different frequencies with which they transmit in a pattern that distinguishes them from other sensing elements 28 thereby facilitating frequency reuse, for instance, with code division multiple access or orthogonal frequency division multiple access. In some embodiments, the microcontroller 16 may transform an output in the frequency domain from the fast Fourier transform into classification of those patterns or combinations thereof. In some cases, the codes or frequency patterns may be selected such that combinations of concurrently transmitted frequency patterns can be distinguished, even if concurrently transmitted and, as a result, overlaid.

In some embodiments, frequency or code division multiple access may be combined with other approaches, like time division multiple access or multiple, stacked signal planes. For example, odd-numbered sensing elements in an address space of sensing elements may transmit on odd-numbered time cycles and even-numbered sensing elements may transmit on even-numbered time cycles, or more complex arrangements may be used, like segmenting time into four, eight, sixteen, or thirty-two or smaller or larger time segments per cycle, to trade some latency for greater frequency reuse. The term "fast" in "fast Fourier transform" is not a relative term requiring some amount of speed, but rather is a term of art that refers to a class of Fourier transform.

In some embodiments, the microcontroller 16 may output to the CPU 18 a stream of touch events, indicating a location, for example in spatial coordinates or with a unique identifier of touch sensing elements and, in some cases, magnitude of sensed touch events or other phenomena. This data may be received by the CPU 18, for example, over a CAN bus or other protocols. In some embodiments, the CPU 18 may also receive sensor data from other sensors 20 and based upon data from the other sensor 20 and the touch sensor 12, exercise control over actuator 22. In some embodiments, the CPU 18, sensors 20 and 12, and actuator 22 may be components of a robot like that described in U.S. patent application Ser. No. 16/918,999, filed 1 Jul. 2020, titled "Artificial Intelligence-Actuated Robot", the contents of which are hereby incorporated by reference. For example, the touch sensor 12 may be disposed on surfaces of the robot expected to make contact with the environment, like the tips of each of the fingers of a hand-shaped end effector and, in some cases, a palm of the end effector. Other types of robotics may also be controlled with the present techniques, which are expected to be particularly beneficial in unstructured and semi-structured environments, like those encountered by drones and self-driving vehicles.

Figure 2:
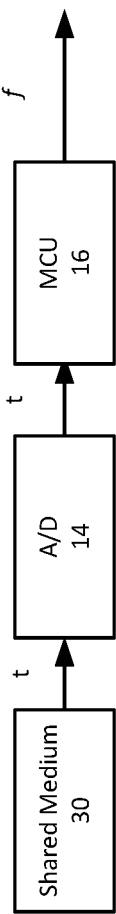
FIG. 2 is a data model and function block diagram that shows an example process by which outputs on a shared medium may be processed to render touch readings mapped to sensors within an array for robotic processing systems, in accordance with some embodiments.

FIG. 2 is a data model and function block diagram that shows an example process by which outputs on a shared medium may be processed to render touch readings mapped to sensors within an array for robotic processing systems, in accordance with some embodiments.

As shown, shared medium 30 may output a signal, like an analog signal, based on combination of outputs of sensing elements (or in some cases, outputs of a plurality of micro controllers reporting for sensor elements) onto the shared medium. The different sensing elements (or micro controllers) may report outputs on different frequencies. In some embodiments, output/read of the different sensing elements (or micro controllers) may occur concurrently (e.g., all at the same time) via the output of the shared medium 30. Output from the shared medium 30 may include reports from hundreds or thousands or more sensors. In some examples, a shared medium 30 may corresponding to a bus of multiple such shared mediums, which may be read serially, or each on a different channel (e.g., each channel corresponding to an iteration of the example steps described below).

The A/D 14 may receive at an input the combined analog signal (e.g., in the time domain) output by the shared medium. The A/D 14 may convert the analog signal into a digital signal in the time domain, such as to be processed with a software digital signal processor implemented within the MCU 16. The MCU 16 may transform the digital signal in the time domain into the frequency domain, such as by executing a FFT over a time slice of the digital signal. The FFT may output information about frequency components of the digital signal, such as their frequency and amplitude within the frequency domain. Thus, for example, reports from different sensing elements may be detected based on their frequency that was a component of the combined output from the shared medium.

The frequency domain may be binned, such as based on ranges of frequency, with each range corresponding to a range of frequencies on which output from a sensing element (or micro controller) is expected to be reported. For example, for a sensor array having 16 different sensing elements, a section of the frequency domain on which the sensing elements are capable of outputting values may be divided into 16 bins. Properties of the different sensing elements may be configured such that their output on the shared medium 30 is reported with a frequency (or frequencies) falling within respective ones of the bins. For example, if sensors are configurable to provide output from 1000-1600 Hz, a first bin may be specified from 1000-1100 Hz, a second bin from 1100-1200 Hz, and so on. In turn, a first sensor may be configured to output at approximately 1050 Hz, a second sensor at approximately 1150 Hz, and so on. Different components of the digital signal may be observed at different frequencies within the frequency domain. Thus, for example, a frequency observed in the digital signal at a frequency or within a range of frequencies may be binned in relation to a sensing element, such as the sensing element that reports on the frequency or within the range of frequencies.

An example mapping consistent with the above techniques is shown. Some embodiments may have a data model corresponding to a sensing array, such as by one or more vectors or a matrix. Positions of values within a vector or matrix may map to corresponding areas within the sensing array. As noted above, the sensing array may be grid-like (e.g., a grid), and sensing points within the array may be mapped to positions of values within a vector or a matrix that represent corresponding locations within the array. Frequency bins may be associated with their respective sensors, or locations within a vector or matrix, such as based on a lookup. For example, a lookup for a frequency may return an identifier of the associated sensor or position in a vector or row and column in an array. As an illustrative example, a mapping may associate sensor identifiers, Sx, with a frequency or frequency bin, fbx. In some examples, both may map to a matrix or vector that includes information indicative of their location within an array. In some examples, such as for a relative square or rectangular array of touch sensors, a matrix may convey position information relatively natively by row/column, where corresponding locations within a physical array may be determined based on dimensions of the physical array for relatively evenly distributed sensing elements.

In some examples, output from the MCU 16 may be provided as a matrix or vectors corresponding to the matrix, and the output may indicate properties about an observed frequency in relation to a corresponding sensing element. For example, an output corresponding S1, fb1 may indicate a location of the observed frequency within a range (e.g., of the bin), or displacement relative to start or end of the range, a last reported frequency, or expected frequency (e.g., corresponding to a natural response). In another example, output corresponding to S1, fb1 may indicate an amplitude of the observed frequency, such as for comparison to one or more thresholds (e.g., to detect a touch, or as in indication of a weak or strong touch force), or as a measurement of force. For example, a sensor element (or micro controller) may output with a variable amplitude on a frequency, and amplitude may increase or decrease responding to force. In some examples, displacement of a frequency within a range, such as described above, may correspond to a measure of force.

Figure 3:
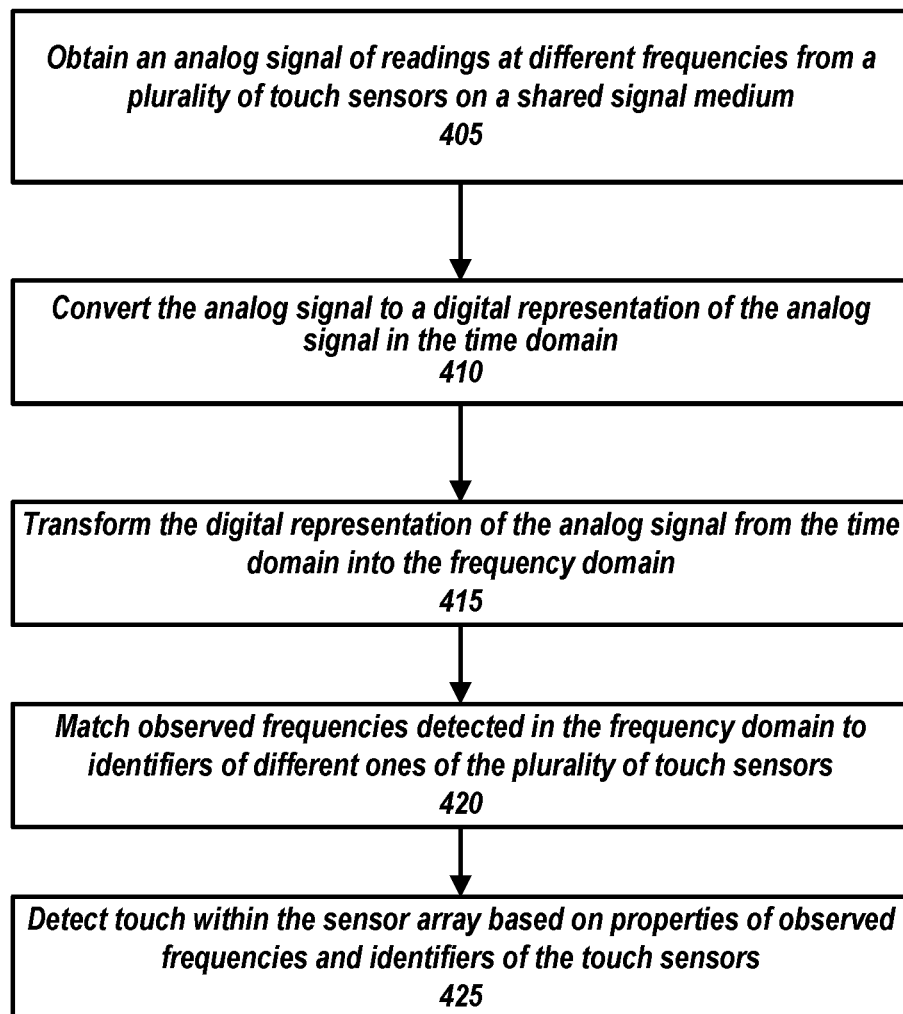
FIG. 3 is a flowchart of an example process by which outputs on a shared medium may be processed to render touch readings mapped to sensors within an array for robotic processing systems, in accordance with some example embodiments.

FIG. 3 is a flowchart of an example process 300 by which outputs on a shared medium may be processed to render touch readings mapped to sensors within an array for robotic processing systems, in accordance with some example embodiments.

In a step 405, embodiments of the process may obtain an analog signal of readings at different frequencies from a plurality of touch sensors on a shared signal medium. For example, a sensor array may generate an analog signal comprising readings at different frequencies from a plurality of touch sensors on the shared signal medium. The analog signal may represent a combination, like a summation, of the readings output by the plurality of touch sensors. The plurality of touch sensors may be spatially distributed within an area corresponding to the shared the signal medium and thus correspond to different areas within the sensor array.

In some examples, a touch sensor is configured to output on a frequency on the signal medium responsive to being touched, and at least some other touch sensors in the plurality of touch sensors being configured to output on other frequencies. In some examples, touch sensors may be configured to output on a set of frequencies on the signal medium responsive to being touched, or output on a first frequency when not touched, and output on another frequency responsive to being touched.

In a step 410, embodiments of the process may covert the analog signal to a digital representation of the analog signal in the time domain. For example, an analog to digital converter electrically coupled to the signal medium may convert the analog signal to a digital representation of the analog signal in the time domain. In some embodiments, the analog-to-digital converter may include a Delta Sigma modulator operative to sense even relatively attenuated signals, for example, in power sensitive use cases. The Delta Sigma modulator may output pulses indicative of changes in the analog signal, and the pulses may propagate in relation to changes in the signal that result from changes in outputs of the different sensing elements at their associated reporting frequencies.

In a step 415, embodiments of the process may transform the digital representation of the analog signal from the time domain into the frequency domain. For example, a processor communicatively coupled to the analog to digital converter may obtain the digital representation of the analog signal in the time domain and transform the digital representation of the analog signal from the time domain into the frequency domain by executing a FFT over the digital representation of the analog signal. In some examples, the processor may implement a software digital signal processor that ingests the digital representation and outputs the frequency components of the digital representation and their amplitude.

In a step 420, embodiments of the process may match observed frequencies detected in the frequency domain to identifiers of different ones of the plurality of touch sensors. For example, a mapping of a frequency or range of frequencies to the different ones of the plurality of touch sensors may be queried based on observed frequencies detected in the frequency domain to return identifiers of different ones of the plurality of touch sensors. In some examples, an address decoder maps a frequency or range of frequencies to the different ones of the plurality of touch sensors and outputs, for an observed frequency, an identifier of a sensor associated with a frequency of a range of frequencies to which the observed frequency corresponds. In some embodiments, mappings may indicate locations of the sensing elements within a sensor array. In some examples, the identifiers may be indicative of sensor location within a sensor array. In some examples, a data structure, like a matrix or vector, may be used to store or convey information like that described above. In some examples, a lookup table or other data structure may be used to match observed frequencies to sensors that report on the respective frequencies.

In a step 425, embodiments of the process may detect touch within the sensor array based on properties of observed frequencies and identifiers of the touch sensors. For example, detection of an observed frequency corresponding to sensor readout may performed based on presence of a component of the digital representation of the signal at a given frequency or within a given range of frequencies within the frequency domain, and presence of the component may be indicative of touch at the sensor. In other words, readout from a sensing element may be detected when that sensing element is activated by a touch. In some examples, each touch sensor is configured to output a reading at a variable amplitude responsive to amount of force of a touch, and detection of an amplitude above a threshold (which may be baseline threshold recorded for the sensor in a rest state, amplitude may differ for different sensors based on their conditions at rest, especially considering flexible sensor arrays which may be disposed on curved surfaces). In some examples, embodiments may identify an observed frequency as being indicative of a touch based on an amplitude exceeding a threshold value. Embodiments may output a detected location of a touch by outputting an identifier to the touch sensor to which an observed frequency is matched, and may output, in association with the identifier, a value indicative of the amplitude as a force measurement corresponding to the touch. In some examples, a touch sensor may be configured to output a reading on a first frequency when not touched, and output on another frequency responsive to being touched. Embodiments may measure an amount of shift (e.g., a delta between the frequencies) as a measure of force.

In some embodiments, robots implementing the present techniques may be trained and controlled with models like those described in U.S. patent application Ser. No. 17/657,723 titled "SPATIO-TEMPORAL CONSISTENCY EMBEDDINGS FROM MULTIPLE OBSERVED MODALITIES".

In some embodiments, robots implementing the present techniques may be trained and controlled with models like those described in U.S. patent application Ser. No. 17/711,960 titled "HYBRID COMPUTING ARCHITECTURES WITH SPECIALIZED PROCESSORS TO ENCODE/DECODE LATENT REPRESENTATIONS FOR CONTROLLING DYNAMIC MECHANICAL SYSTEMS".

In some embodiments, robots implementing the present techniques may be administered with systems like those described in U.S. patent application Ser. No. 17/711,973 titled "SYSTEM FOR PRESENTING ROBOTIC DATA FLOWS FOR APPLICATION DEVELOPMENT".

In some embodiments, fleets of robots implementing the present techniques may managed with systems like those described in a U.S. patent application Ser. No. 17/711,991 titled "CONFIGURING AND MANAGING FLEETS OF DYNAMIC MECHANICAL SYSTEMS".

In some embodiments, fleets of robots implementing the present techniques may managed with systems like those described in U.S. patent application Ser. No. 17/711,997 titled "SCHEDULER FOR ROBOT FLEETS".

Figure 4:
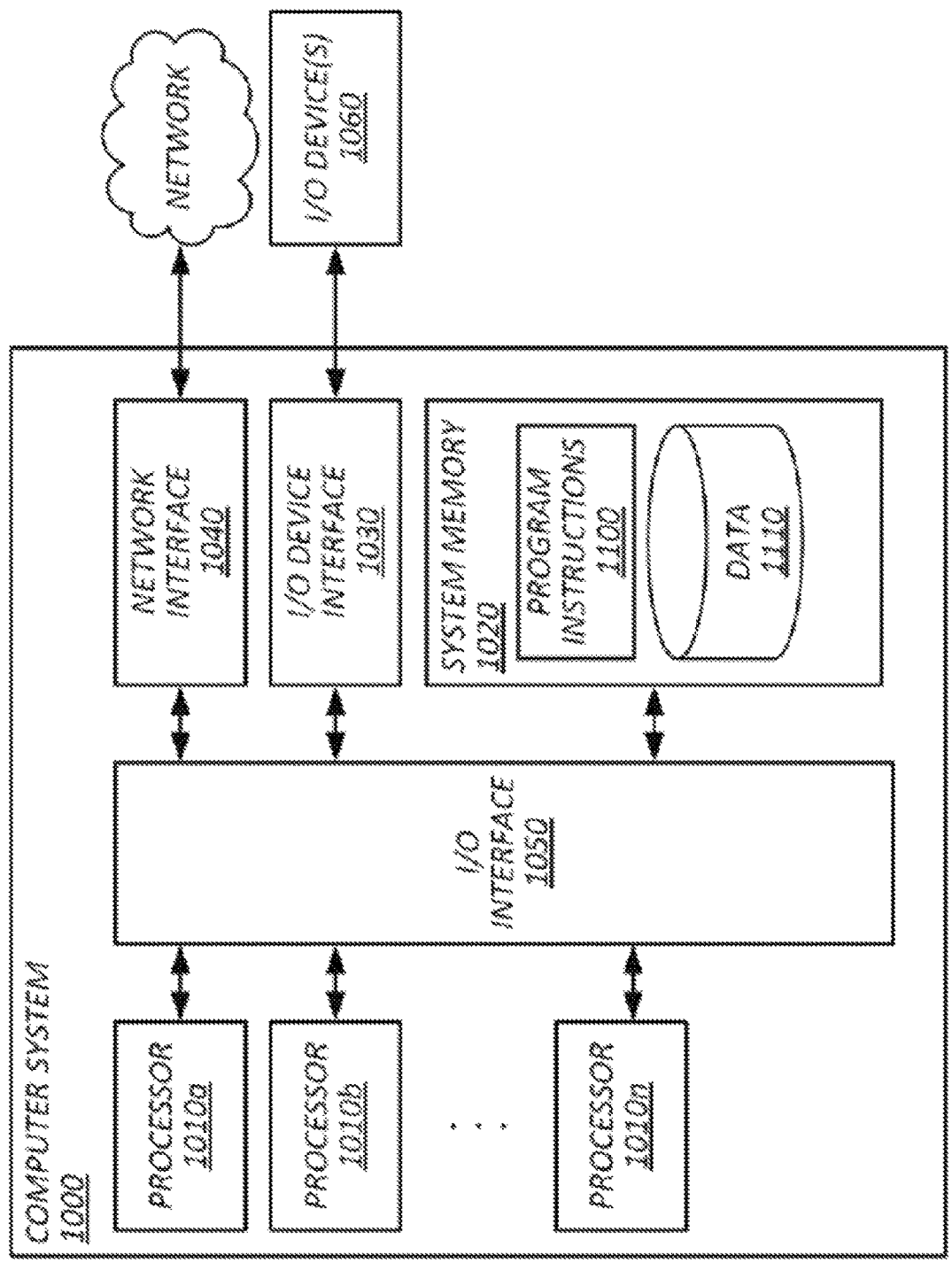
FIG. 4 is a physical architecture block diagram that shows an example of a computing device (or data processing system) by which some aspects of the above techniques may be implemented, in accordance with some example embodiments.

FIG. 4 is a physical architecture block diagram that shows an example of a computing device (or data processing system) by which some aspects of the above techniques may be implemented. Various portions of systems and methods described herein, may include or be executed on one or more computer systems similar to computing system 1000. Further, processes and modules described herein may be executed by one or more processing systems similar to that of computing system 1000.

Computing system 1000 may include one or more processors (e.g., processors 1010 a-1010 n) coupled to system memory 1020, an input/output I/O device interface 1030, and a network interface 1040 via an input/output (I/O) interface 1050. A processor may include a single processor or a plurality of processors (e.g., distributed processors). A processor may be any suitable processor capable of executing or otherwise performing instructions. A processor may include a central processing unit (CPU) that carries out program instructions to perform the arithmetical, logical, and input/output operations of computing system 1000. A processor may execute code (e.g., processor firmware, a protocol stack, a database management system, an operating system, or a combination thereof) that creates an execution environment for program instructions. A processor may include a programmable processor. A processor may include general or special purpose microprocessors. A processor may receive instructions and data from a memory (e.g., system memory 1020). Computing system 1000 may be a uni-processor system including one processor (e.g., processor 1010 a), or a multi-processor system including any number of suitable processors (e.g., 1010 a-1010 n). Multiple processors may be employed to provide for parallel or sequential execution of one or more portions of the techniques described herein. Processes, such as logic flows, described herein may be performed by one or more programmable processors executing one or more computer programs to perform functions by operating on input data and generating corresponding output. Processes described herein may be performed by, and apparatus can also be implemented as, special purpose logic circuitry, e.g., an FPGA (field programmable gate array) or an ASIC (application specific integrated circuit). Computing system 1000 may include a plurality of computing devices (e.g., distributed computer systems) to implement various processing functions.

I/O device interface 1030 may provide an interface for connection of one or more I/O devices 1060 to computer system 1000. I/O devices may include devices that receive input (e.g., from a user) or output information (e.g., to a user). I/O devices 1060 may include, for example, graphical user interface presented on displays (e.g., a cathode ray tube (CRT) or liquid crystal display (LCD) monitor), pointing devices (e.g., a computer mouse or trackball), keyboards, keypads, touchpads, scanning devices, voice recognition devices, gesture recognition devices, printers, audio speakers, microphones, cameras, or the like. I/O devices 1060 may be connected to computer system 1000 through a wired or wireless connection. I/O devices 1060 may be connected to computer system 1000 from a remote location. I/O devices 1060 located on remote computer system, for example, may be connected to computer system 1000 via a network and network interface 1040.

Network interface 1040 may include a network adapter that provides for connection of computer system 1000 to a network. Network interface 1040 may facilitate data exchange between computer system 1000 and other devices connected to the network. Network interface 1040 may support wired or wireless communication. The network may include an electronic communication network, such as the Internet, a local area network (LAN), a wide area network (WAN), a cellular communications network, or the like.

System memory 1020 may be configured to store program instructions 1100 or data 1110. Program instructions 1100 may be executable by a processor (e.g., one or more of processors 1010 a-1010 n) to implement one or more embodiments of the present techniques. Instructions 1100 may include modules of computer program instructions for implementing one or more techniques described herein with regard to various processing modules. Program instructions may include a computer program (which in certain forms is known as a program, software, software application, script, or code). A computer program may be written in a programming language, including compiled or interpreted languages, or declarative or procedural languages. A computer program may include a unit suitable for use in a computing environment, including as a stand-alone program, a module, a component, or a subroutine. A computer program may or may not correspond to a file in a file system. A program may be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program may be deployed to be executed on one or more computer processors located locally at one site or distributed across multiple remote sites and interconnected by a communication network.

System memory 1020 may include a tangible program carrier having program instructions stored thereon. A tangible program carrier may include a non-transitory computer readable storage medium. A non-transitory computer readable storage medium may include a machine readable storage device, a machine readable storage substrate, a memory device, or any combination thereof. Non-transitory computer readable storage medium may include non-volatile memory (e.g., flash memory, ROM, PROM, EPROM, EEPROM memory), volatile memory (e.g., random access memory (RAM), static random access memory (SRAM), synchronous dynamic RAM (SDRAM)), bulk storage memory (e.g., CD-ROM and/or DVD-ROM, hard-drives), or the like. System memory 1020 may include a non-transitory computer readable storage medium that may have program instructions stored thereon that are executable by a computer processor (e.g., one or more of processors 1010 a-1010 n) to cause the subject matter and the functional operations described herein. A memory (e.g., system memory 1020) may include a single memory device and/or a plurality of memory devices (e.g., distributed memory devices). Instructions or other program code to provide the functionality described herein may be stored on a tangible, non-transitory computer readable media. In some cases, the entire set of instructions may be stored concurrently on the media, or in some cases, different parts of the instructions may be stored on the same media at different times.

I/O interface 1050 may be configured to coordinate I/O traffic between processors 1010 a-1010 n, system memory 1020, network interface 1040, I/O devices 1060, and/or other peripheral devices. I/O interface 1050 may perform protocol, timing, or other data transformations to convert data signals from one component (e.g., system memory 1020) into a format suitable for use by another component (e.g., processors 1010 a-1010 n). I/O interface 1050 may include support for devices attached through various types of peripheral buses, such as a variant of the Peripheral Component Interconnect (PCI) bus standard or the Universal Serial Bus (USB) standard.

Embodiments of the techniques described herein may be implemented using a single instance of computer system 1000 or multiple computer systems 1000 configured to host different portions or instances of embodiments. Multiple computer systems 1000 may provide for parallel or sequential processing/execution of one or more portions of the techniques described herein.

Those skilled in the art will appreciate that computer system 1000 is merely illustrative and is not intended to limit the scope of the techniques described herein. Computer system 1000 may include any combination of devices or software that may perform or otherwise provide for the performance of the techniques described herein. For example, computer system 1000 may include or be a combination of a cloud-computing system, a data center, a server rack, a server, a virtual server, a desktop computer, a laptop computer, a tablet computer, a server device, a client device, a mobile telephone, a personal digital assistant (PDA), a mobile audio or video player, a game console, a vehicle-mounted computer, or a Global Positioning System (GPS), or the like. Computer system 1000 may also be connected to other devices that are not illustrated, or may operate as a stand-alone system. In addition, the functionality provided by the illustrated components may in some embodiments be combined in fewer components or distributed in additional components. Similarly, in some embodiments, the functionality of some of the illustrated components may not be provided or other additional functionality may be available.

Those skilled in the art will also appreciate that while various items are illustrated as being stored in memory or on storage while being used, these items or portions of them may be transferred between memory and other storage devices for purposes of memory management and data integrity. Alternatively, in other embodiments some or all of the software components may execute in memory on another device and communicate with the illustrated computer system via inter-computer communication. Some or all of the system components or data structures may also be stored (e.g., as instructions or structured data) on a computer-accessible medium or a portable article to be read by an appropriate drive, various examples of which are described above. In some embodiments, instructions stored on a computer-accessible medium separate from computer system 1000 may be transmitted to computer system 1000 via transmission media or signals such as electrical, electromagnetic, or digital signals, conveyed via a communication medium such as a network or a wireless link. Various embodiments may further include receiving, sending, or storing instructions or data implemented in accordance with the foregoing description upon a computer-accessible medium. Accordingly, the present techniques may be practiced with other computer system configurations.

In block diagrams, illustrated components are depicted as discrete functional blocks, but embodiments are not limited to systems in which the functionality described herein is organized as illustrated. The functionality provided by each of the components may be provided by software or hardware modules that are differently organized than is presently depicted, for example such software or hardware may be intermingled, conjoined, replicated, broken up, distributed (e.g., within a data center or geographically), or otherwise differently organized. The functionality described herein may be provided by one or more processors of one or more computers executing code stored on a tangible, non-transitory, machine readable medium. In some cases, notwithstanding use of the singular term "medium," the instructions may be distributed on different storage devices associated with different computing devices, for instance, with each computing device having a different subset of the instructions, an implementation consistent with usage of the singular term "medium" herein. In some cases, third party content delivery networks may host some or all of the information conveyed over networks, in which case, to the extent information (e.g., content) can be said to be supplied or otherwise provided, the information may be provided by sending instructions to retrieve that information from a content delivery network.

The reader should appreciate that the present application describes several independently useful techniques. Rather than separating those techniques into multiple isolated patent applications, applicants have grouped these techniques into a single document because their related subject matter lends itself to economies in the application process. But the distinct advantages and aspects of such techniques should not be conflated. In some cases, embodiments address all of the deficiencies noted herein, but it should be understood that the techniques are independently useful, and some embodiments address only a subset of such problems or offer other, unmentioned benefits that will be apparent to those of skill in the art reviewing the present disclosure. Due to costs constraints, some techniques disclosed herein may not be presently claimed and may be claimed in later filings, such as continuation applications or by amending the present claims. Similarly, due to space constraints, neither the Abstract nor the Summary of the Invention sections of the present document should be taken as containing a comprehensive listing of all such techniques or all aspects of such techniques.

It should be understood that the description is not intended to limit the present techniques to the particular form disclosed, but to the contrary, the intention is to cover all modifications, equivalents, and alternatives falling within the spirit and scope of the present techniques as defined by the appended claims. Further modifications and alternative embodiments of various aspects of the techniques will be apparent to those skilled in the art in view of this description. Accordingly, this description and the drawings are to be construed as illustrative only and are for the purpose of teaching those skilled in the art the general manner of carrying out the present techniques. It is to be understood that the forms of the present techniques shown and described herein are to be taken as examples of embodiments. Elements and materials may be substituted for those illustrated and described herein, parts and processes may be reversed or omitted, and certain features of the present techniques may be utilized independently, all as would be apparent to one skilled in the art after having the benefit of this description of the present techniques. Changes may be made in the elements described herein without departing from the spirit and scope of the present techniques as described in the following claims. Headings used herein are for organizational purposes only and are not meant to be used to limit the scope of the description.

As used throughout this application, the word "may" is used in a permissive sense (i.e., meaning having the potential to), rather than the mandatory sense (i.e., meaning must). The words "include", "including", and "includes" and the like mean including, but not limited to. As used throughout this application, the singular forms "a," "an," and "the" include plural referents unless the content explicitly indicates otherwise. Thus, for example, reference to "an element" or "a element" includes a combination of two or more elements, notwithstanding use of other terms and phrases for one or more elements, such as "one or more." The term "or" is, unless indicated otherwise, non-exclusive, i.e., encompassing both "and" and "or." Terms describing conditional relationships, e.g., "in response to X, Y," "upon X, Y,", "if X, Y," "when X, Y," and the like, encompass causal relationships in which the antecedent is a necessary causal condition, the antecedent is a sufficient causal condition, or the antecedent is a contributory causal condition of the consequent, e.g., "state X occurs upon condition Y obtaining" is generic to "X occurs solely upon Y" and "X occurs upon Y and Z." Such conditional relationships are not limited to consequences that instantly follow the antecedent obtaining, as some consequences may be delayed, and in conditional statements, antecedents are connected to their consequents, e.g., the antecedent is relevant to the likelihood of the consequent occurring. Statements in which a plurality of attributes or functions are mapped to a plurality of objects (e.g., one or more processors performing steps A, B, C, and D) encompasses both all such attributes or functions being mapped to all such objects and subsets of the attributes or functions being mapped to subsets of the attributes or functions (e.g., both all processors each performing steps A-D, and a case in which processor 1 performs step A, processor 2 performs step B and part of step C, and processor 3 performs part of step C and step D), unless otherwise indicated. Similarly, reference to "a computer system" performing step A and "the computer system" performing step B can include the same computing device within the computer system performing both steps or different computing devices within the computer system performing steps A and B. Further, unless otherwise indicated, statements that one value or action is "based on" another condition or value encompass both instances in which the condition or value is the sole factor and instances in which the condition or value is one factor among a plurality of factors. Unless otherwise indicated, statements that "each" instance of some collection have some property should not be read to exclude cases where some otherwise identical or similar members of a larger collection do not have the property, i.e., each does not necessarily mean each and every. Limitations as to sequence of recited steps should not be read into the claims unless explicitly specified, e.g., with explicit language like "after performing X, performing Y," in contrast to statements that might be improperly argued to imply sequence limitations, like "performing X on items, performing Y on the X'ed items," used for purposes of making claims more readable rather than specifying sequence. Statements referring to "at least Z of A, B, and C," and the like (e.g., "at least Z of A, B, or C"), refer to at least Z of the listed categories (A, B, and C) and do not require at least Z units in each category. Unless specifically stated otherwise, as apparent from the discussion, it is appreciated that throughout this specification discussions utilizing terms such as "processing," "computing," "calculating," "determining" or the like refer to actions or processes of a specific apparatus, such as a special purpose computer or a similar special purpose electronic processing/computing device. Features described with reference to geometric constructs, like "parallel," "perpendicular/orthogonal," "square", "cylindrical," and the like, should be construed as encompassing items that substantially embody the properties of the geometric construct, e.g., reference to "parallel" surfaces encompasses substantially parallel surfaces. The permitted range of deviation from Platonic ideals of these geometric constructs is to be determined with reference to ranges in the specification, and where such ranges are not stated, with reference to industry norms in the field of use, and where such ranges are not defined, with reference to industry norms in the field of manufacturing of the designated feature, and where such ranges are not defined, features substantially embodying a geometric construct should be construed to include those features within 15% of the defining attributes of that geometric construct. The terms "first", "second", "third," "given" and so on, if used in the claims, are used to distinguish or otherwise identify, and not to show a sequential or numerical limitation. As is the case in ordinary usage in the field, data structures and formats described with reference to uses salient to a human need not be presented in a human-intelligible format to constitute the described data structure or format, e.g., text need not be rendered or even encoded in Unicode or ASCII to constitute text; images, maps, and data-visualizations need not be displayed or decoded to constitute images, maps, and data-visualizations, respectively; speech, music, and other audio need not be emitted through a speaker or decoded to constitute speech, music, or other audio, respectively. Computer implemented instructions, commands, and the like are not limited to executable code and can be implemented in the form of data that causes functionality to be invoked, e.g., in the form of arguments of a function or API call. To the extent bespoke noun phrases (and other coined terms) are used in the claims and lack a self-evident construction, the definition of such phrases may be recited in the claim itself, in which case, the use of such bespoke noun phrases should not be taken as invitation to impart additional limitations by looking to the specification or extrinsic evidence.

In this patent, to the extent any U.S. patents, U.S. patent applications, or other materials (e.g., articles) have been incorporated by reference, the text of such materials is only incorporated by reference to the extent that no conflict exists between such material and the statements and drawings set forth herein. In the event of such conflict, the text of the present document governs, and terms in this document should not be given a narrower reading in virtue of the way in which those terms are used in other materials incorporated by reference.

The present techniques will be better understood when considered in view of the following enumerated examples:

Example 1. A system, comprising: a plurality of spatially distributed touch sensors of a sensor array sharing a signal medium, each touch sensor in the plurality being configured to output an analog signal on a frequency on the signal medium responsive to being touched, each touch sensor in the plurality of touch sensors being configured to output an analog signal on a different frequency; an analog to digital converter electrically coupled to the signal medium and configured to: receive a combined analog signal from the signal medium, the combined analog signal comprising a set of analog signals output on a set of different frequencies by a respective set of touch sensors; and convert the combined analog signal to a digital representation of the combined analog signal in the time domain; a processor communicatively coupled to the analog to digital converter and configured to: execute a fast Fourier transform to transform the digital representation from the time domain into the frequency domain; and detect locations of a touch within the sensor array based on properties of observed frequencies in the frequency domain and identifiers of the touch sensor to which the observed frequencies are mapped.

Example 2. The system of example 1, wherein: an address decoder maps a frequency or range of frequencies to the different ones of the plurality of touch sensors.

Example 3. The system of example 2, wherein: the address decoder outputs, for an observed frequency, an identifier of a sensor associated with a frequency of a range of frequencies to which the observed frequency corresponds.

Example 4. The system of example 1, wherein a property of an observed frequency within the frequency domain comprises one or more of: an amplitude; and displacement of an observed frequency within a range of frequencies relative to prior observed frequency or a frequency corresponding a output of a sensor in an untouched state.

Example 5. The system of example 1, wherein: wherein each touch sensor is configured to output an analog signal on a set of frequencies on the signal medium responsive to being touched, each touch sensor in the plurality of touch sensors being configured to output an analog signal on a different set of frequencies;

Example 6. The system of example 1, wherein: a touch sensor is configured to output on a first frequency when not touched, and outputs on another frequency responsive to being touched.

Example 7. The system of example 6, wherein: wherein an amount of shift between the first frequency and the another frequency is indicative of a force corresponding to being touched, the output at the another frequency being detected within a given frequency range associated with the touch sensor when the output on the first frequency is not detected.

Example 8. The system of example 1, wherein: each touch sensor is configured to output an analog signal at a variably amplitude responsive to amount of force of a touch.

Example 9. The system of example 1, wherein: the analog-to-digital converter samples the combined analog signal on the shared medium with a sampling frequency more than twice that of the highest frequency used a sensor in the array of sensors.

Example 10. The system of example 1, wherein: the analog-to-digital converter includes a Delta Sigma modulator operative to sense an attenuated combined analog signal when the sensor array is placed in a low power mode.

Example 11. A method, comprising: obtaining, from a sensor array comprising a shared signal medium, an analog signal comprising readings at different frequencies from a plurality of touch sensors on the shared signal medium; converting, by an analog to digital converter electrically coupled to the signal medium, the analog signal to a digital representation of the analog signal in the time domain; obtaining, by a processor communicatively coupled to the analog to digital converter, the digital representation of the analog signal in the time domain; transforming, by the processor, the digital representation of the analog signal from the time domain into the frequency domain; matching observed frequencies detected in the frequency domain to identifiers of different ones of the plurality of touch sensors based on a mapping of a frequency or range of frequencies to the different ones of the plurality of touch sensors; and detecting locations of touch within the sensor array based on properties of observed frequencies and identifiers of the touch sensors to which the observed frequencies are matched.

Example 12. The method of example 11, wherein: wherein the plurality of touch sensors are spatially distributed within an area corresponding to the shared signal medium, and each sensor identifier is associated with a location within the area corresponding to the shared signal medium.

Example 13. The method of example 11, wherein: an address decoder maps a frequency or range of frequencies to the different ones of the plurality of touch sensors, and the address decoder outputs, for an observed frequency, an identifier of a sensor associated with a frequency of a range of frequencies that matches to the observed frequency.

Example 14. The method of example 11, wherein: transforming the digital representation of the analog signal from the time domain into a digital representation in the frequency domain comprises executing a fast Fourier to distinguish different readings output at different frequencies by their frequency.

Example 15. The method of example 14, further comprising: detecting an observed frequency corresponding to a reading based on presence of a component of the digital representation of the signal at a given frequency or within a given range of frequencies within the frequency domain.

Example 16. The method of example 11, wherein: each touch sensor is configured to output a reading at a variable amplitude responsive to amount of force of a touch.

Example 17. The method of example 16, further comprising: identifying an observed frequency as being indicative of a touch based on an amplitude exceeding a threshold value; and outputting a detected location of the touch by outputting the identifier to the touch sensor to which the observed frequency is matched.

Example 18. The method of example 17, further comprising: outputting, in association with the identifier, a value indicative of the amplitude as a force measurement corresponding to the touch.

Example 19. The method of example 11, wherein: a touch sensor is configured to output a reading on a first frequency when not touched, and outputs on another frequency responsive to being touched.

Example 20. The method of example 19, wherein: wherein an amount of shift between the first frequency and the another frequency is indicative of a force corresponding to being touched, the output at the another frequency being detected within a given frequency range associated with the touch sensor when the output on the first frequency is not detected.

The invention claimed is:

1. A system comprising:
a robot having contact surfaces;
a sensor array comprising a plurality of spatially distributed touch sensors disposed on the contact surfaces, each touch sensor having an identifier and configured to output an analog signal at a set of frequencies associated with the identifier, the sensor array configured to output a combined analog signal representative of a combination of the analog signals outputted by the touch sensors;
an analog-to-digital converter communicatively coupled to the sensor array, wherein the analog-to-digital converter generates a digital signal in a time domain based on the combined analog signal; and
one or more processing units communicatively coupled to the analog-to-digital converter, the one or more processing units configured to perform operations comprising:
transforming the digital signal from the time domain to a frequency domain; and
detecting locations of touch within the sensor array based on frequencies observed in the frequency domain and the identifiers of the touch sensors.

2. The system of claim 1, wherein the sensor array comprises a shared signal medium configured to accept the analog signals outputted by the touch sensors and generate the combined analog signal.

3. The system of claim 1, wherein the one or more processing units are coupled to the robot.

4. The system of claim 1, wherein transforming the digital signal from the time domain to the frequency domain comprises executing Fast Fourier Transform on the digital signal in the time domain.

5. The system of claim 1, wherein the one or more processing units is coupled to memory comprising a look up table that maps a range of frequencies to the identifiers, and wherein the operations further comprise:
   determining the identifiers of the touch sensors corresponding to the frequencies observed in the frequency domain using the look up table.

6. The system of claim 5, wherein the operations further comprise:
   determining a first identifier from the look up table based on a first frequency observed in the frequent domain; and
   outputting at least one of the first identifier and an amplitude of the first frequency.

7. The system of claim 1, wherein the combined analog signal and the digital signal in the time domain are each a single respective channel of information in which the analog signals outputted by the touch sensors are overlaid.

8. The system of claim 1, wherein at least one of the touch sensors is configured to output a first frequency when not touched and a second frequency when touched, and wherein the operations further comprise:
   determining a touch force applied to the at least one of the touch sensors based on the first frequency and the second frequency.

9. The system of claim 1, wherein at least one of the touch sensors is configured to output an analog signal at an amplitude responsive to an amount of touch force applied to the at least one of the touch sensors.

10. The system of claim 1, wherein the analog-to-digital converter is configured to sample the combined analog signal at a sampling frequency greater than twice a highest frequency outputted by the touch sensors.

11. The system of claim 1, wherein the analog-to-digital converter comprises a Delta Sigma modulator operable to sense an attenuated combined analog signal when the sensor array is in a low power mode.

12. The system of claim 1, wherein the contact surfaces are exposed to an external environment of the robot.

13. A method comprising:
   obtaining a combined analog signal representative of a combination of analog signals outputted by a plurality of spatially distributed touch sensors disposed on contact surfaces of a robot;
   converting the combined analog signal to a digital signal in a time domain;
   transforming the digital signal from the time domain to a frequency domain;
   accessing a mapping between a set of identifiers for the touch sensors and a set of frequencies; and
   detecting locations of touch within the sensor array based on frequencies observed in the frequency domain and the mapping.

14. The method of claim 13, wherein each touch sensor outputs an analog signal at a subset of the set of frequencies.

15. The method of claim 13, wherein transforming the digital signal from the time domain to the frequency domain comprises executing Fast Fourier Transform on the digital signal in the time domain.

16. The method of claim 13, further comprising:
   determining that a first frequency observed in the frequency domain has an amplitude exceeding a threshold value;
   determining an identifier of a first touch sensor corresponding to the first frequency using the mapping; and
   outputting the identifier of the first touch sensor.

17. The method of claim 16, further comprising:
   determining a touch force for the first touch sensor based on the amplitude of the first frequency; and
   outputting the touch force in association with the identifier of the first touch sensor.

18. The method of claim 13, comprising:
   determining from a first sample of the digital signal a first observed frequency corresponding to touching a first touch sensor;
   determining from a second sample of the digital signal a second observed frequency corresponding to not touching the first touch sensor; and
   determining a touch force applied to the first touch sensor based on an amount of shift between the first frequency and the second frequency.

19. The method of claim 13, wherein converting the combined analog signal to a digital signal in a time domain comprises sampling the combined analog signal at a sampling frequency greater than twice a highest frequency outputted by the touch sensors.

* * * * *